(12) United States Patent
Lu

(10) Patent No.: US 12,333,171 B2
(45) Date of Patent: Jun. 17, 2025

(54) MONOTONIC COUNTERS AND COUNTING METHODS BY MONOTONIC COUNTER

(71) Applicant: WUHAN XINXIN SEMICONDUCTOR MANUFACTURING CO., LTD., Hubei (CN)

(72) Inventor: Zhongzhou Lu, Hubei (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 0 days.

(21) Appl. No.: 18/328,741

(22) Filed: Jun. 4, 2023

(65) Prior Publication Data
US 2023/0315318 A1   Oct. 5, 2023

Related U.S. Application Data

(63) Continuation of application No. PCT/CN2020/138227, filed on Dec. 22, 2020.

(30) Foreign Application Priority Data

Dec. 11, 2020   (CN) .......................... 202011459160.4

(51) Int. Cl.
G06F 3/06        (2006.01)

(52) U.S. Cl.
CPC ............ *G06F 3/064* (2013.01); *G06F 3/0604* (2013.01); *G06F 3/0652* (2013.01); *G06F 3/0673* (2013.01)

(58) Field of Classification Search
CPC ...... G06F 3/064; G06F 3/0604; G06F 3/0652; G06F 3/0673
See application file for complete search history.

(56) References Cited

U.S. PATENT DOCUMENTS 6,128,695 A   10/2000 Estakhri et al.
6,836,853 B1  12/2004 Dover et al.
(Continued)

FOREIGN PATENT DOCUMENTS

CN    1700642 A    11/2005
CN  103295632 A     9/2013
(Continued)

OTHER PUBLICATIONS

Replay protection monotonic counter, reading method and counting method thereof, https://patents.google.com/patent/CN104657678A/en, Translation reference CN104657678A published May 27, 2015. (Year: 2013).*

(Continued)

*Primary Examiner* — Baboucarr Faal
(74) *Attorney, Agent, or Firm* — Nathan & Associates Patent Agents Ltd.; Menachem Nathan

(57) ABSTRACT

A monotonic counter includes a plurality of storage blocks and a controller. Each of the storage blocks has a plurality of count storage units for sequentially storing at least data bit of count data. There is one of the storage blocks serving as a working storage block at any time. The controller includes: interrupt recording circuitry for recording an interrupt; and logic determination circuitry for determining, upon determining that the monotonic counter with the interrupt has been powered on and reset, whether the count storage units of the working storage block are all full, and when the count storage units of the working storage block are not all full, writing preset data again in one of the count storage units of the working storage block into which the data bit of the count data is stored last.

18 Claims, 2 Drawing Sheets

S101

Upon detecting an interrupt occurring in the monotonic counter, determining whether the count storage units of the working storage block are all full or not

S102

In response to determining that the count storage units of the working storage block are not all full, writing preset data again in one of the count storage units of the working storage block into which the data bit of the count data is stored last

(56) References Cited

U.S. PATENT DOCUMENTS

| | | | |
|---|---|---|---|
| 2011/0162083 A1 | 6/2011 | Apvrille et al. | |
| 2015/0253220 A1 | 9/2015 | Shibayama et al. | |
| 2020/0007332 A1* | 1/2020 | Girkar ................... | H04L 9/3213 |

FOREIGN PATENT DOCUMENTS

| | | | |
|---|---|---|---|
| CN | 104657678 A | 5/2015 | |
| CN | 111261214 A | 6/2020 | |
| EP | 1416498 A1 | 5/2004 | |
| JP | 2000339232 A | 12/2000 | |

OTHER PUBLICATIONS

Chinese Office Action issued in corresponding Chinese Patent Application No. 202011459160.4 dated Dec. 17, 2021, pp. 1-8.
Chinese Notice of Allowance issued in corresponding Chinese Patent Application No. 202011459160.4 dated May 10, 2022, pp. 1-4.
International Search Report in International application No. PCT/CN2020/138227, mailed on Dec. 22, 2020.
Written Opinion of the International Search Authority in International application No. PCT/CN2020/138227, mailed on Dec. 22, 2020.

* cited by examiner

MONOTONIC COUNTERS AND COUNTING METHODS BY MONOTONIC COUNTER

CROSS-REFERENCE TO RELATED APPLICATIONS

This application is a continuation of International Application No. PCT/CN2020/138227, filed on Dec. 22, 2020, which claims priority to and the benefit of Chinese Patent Application No. 202011459160.4, filed on Dec. 11, 2020. The disclosures of the aforementioned applications are incorporated herein by reference in their entireties.

TECHNICAL FIELD

The present application relates to communication technologies, and more particularly, to monotonic counters and counting methods by a monotonic counter.

BACKGROUND

A replay protection monotonic counter (RPMC) is a counter having a monotonic counting function. After a count value is recorded in the RPMC, the RPMC will only increases monotonically the count value. The RPMC is generally used with a flash memory for ensuring confidentiality and integrity of reading and writing data during data access. For example, the RPMC is used with the flash memory for determining the number of times of data access with respect to the flash memory. Each time data access with respect to the flash memory is performed, the count value is incremented in the monotonic counter, thereby providing a complete data record of the number of times of data access with respect to the flash memory. For another example, in a data transmission process, the data is monotonically counted to ensure non-repetition of the data, so that the confidentiality of the data transmission can be improved.

However, in the related art, when an abnormality (such as abnormal power failure, abnormal reset, voltage instability or the like) occurs in the RPMC, a counting operation by the monotonic counter tends to be erroneous.

SUMMARY

In view of the above, an embodiment of the present application provides a monotonic counter including a controller and a plurality of storage blocks, where each of the storage blocks comprises a first unit for storing at least one count base bit, a second unit for storing at least one flag bit, a third unit for storing at least one check bit, and a plurality of count storage units for sequentially storing at least one data bit of count data, and at any time when the monotonic counter is in operation, there is one of the plurality of storage blocks serving as a working storage block for counting, and where the controller includes:
  interrupt recording circuitry for recording an interrupt occurring in the monotonic counter; and
  logic determination circuitry for determining, upon determining that the monotonic counter with the interrupt has been powered on and reset, whether the count storage units of the working storage block are all full or not, and in response to determining that the count storage units of the working storage block are not all full, writing preset data again in one of the count storage units of the working storage block into which the data bit of the count data are stored last.

Another embodiment of the present application provides a counting method by a monotonic counter including a plurality of storage blocks, where each of the storage blocks comprises a first unit for storing at least one count base bit, a second unit for storing at least one flag bit, a third unit for storing at least one check bit, and a plurality of count storage units for sequentially storing at least one data bit of count data, and at any time when the monotonic counter is in operation, there is one of the plurality of storage blocks serving as a working storage block for counting, and where the counting method includes:
  upon detecting an interrupt occurring in the monotonic counter, determining whether the count storage units of the working storage block are all full or not; and
  in response to determining that the count storage units of the working storage block are not all full, writing preset data again in one of the count storage units of the working storage block into which the data bit of the count data are stored last.

DETAILED DESCRIPTION

Some embodiments of the present application will be described in detail below in conjunction with the drawings. The embodiments are described for illustration only, but not intended to limit the present application.

It should be readily understood that, when an abnormality occurs in the RPMC, resulting in interrupt of the counter, and then the counter is powered on and reset, some measures need to be taken to prevent the RPMC from subsequent abnormal reading. However, when the interrupt occurs in the RPMC, there may be four possible operation states of a working storage block within the counter in which the counting operation is performed, which are as follows: 1. the working storage block is full or not; 2. the working storage block is fully but a new working storage block has not been switched so as to continue counting; 3. the new working storage block has been switched so as to continue counting, but the working storage block that is full has not yet erased; and 4. the new working storage block has been switched so as to continue counting, but the working storage block that is full is being erased.

In view of the above four possible situations, the present application proposes the following measures.

Figure 1:
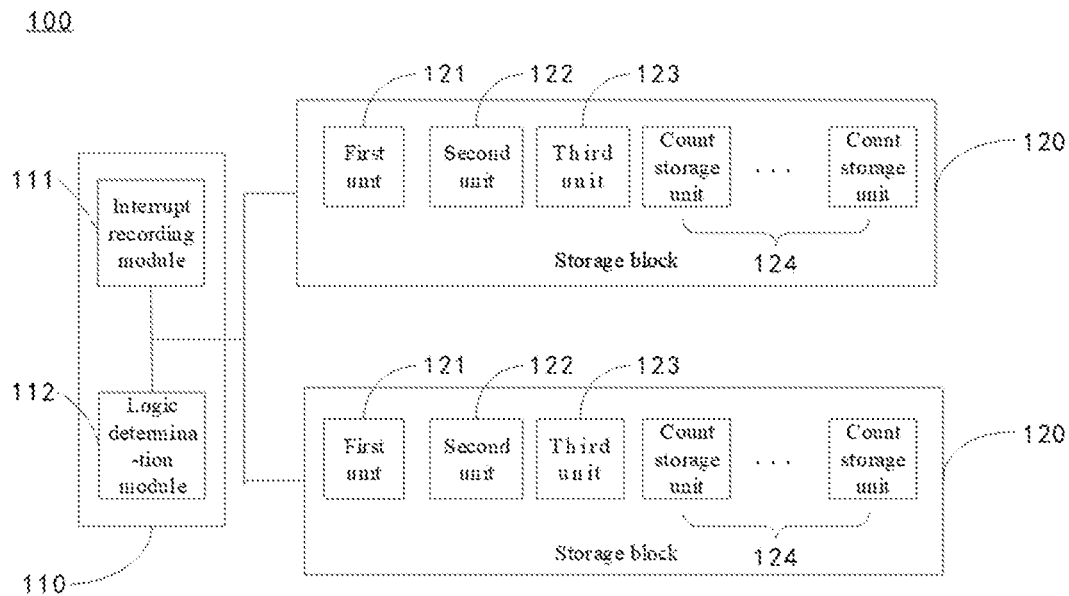
FIG. 1 is a schematic block diagram of a monotonic counter according to an embodiment of the present application.

Referring to FIG. 1, which is a schematic block diagram of a monotonic counter 100 according to an embodiment of the present application, it can be seen from FIG. 1 that various components of the embodiment of the present application and the relative position relationship of the components are shown.

As shown in FIG. 1, the monotonic counter 100 includes a controller 110 and a plurality of storage blocks 120, where each of the storage blocks 120 includes a first unit for storing at least one count base bit 121, a second unit for storing at least one flag bit 122, a third unit for storing at least one check bit 123, and a plurality of count storage units for sequentially storing at least one data bit of count data 124, and at any time when the monotonic counter is in operation, there is one of the plurality of storage blocks 120 serving as a working storage block for counting, where the controller 110 may specifically include: interrupt recording circuitry 111 for recording an interrupt occurring in the monotonic counter 100; and logic determination circuitry 112 for determining, upon determining that the monotonic counter 100 with the interrupt has been powered on and reset, whether the count storage units 124 of the working storage block are all full or not, and in response to determining that the count storage units 124 of the working storage block are not all full, writing preset data again in one of the count storage units 124 of the working storage block into which the data bit of the count data are stored last.

It should be noted that the monotonic counter 100 is used to ensure the confidentiality and integrity of reading and/or writing data from/into a memory corresponding to the counter, and the count data in the monotonic counter 100 can be monotonically incremented. Since the count storage units 124 of each of the storage blocks 120 in the monotonic counter 100 are limited, when the count storage units in one working storage block 120 in the monotonic counter 100 are full, a new working storage block or the working storage block may have been erased may be switched, so as to continue counting. When the new working storage block is switched so as to continue counting, the count data of the working storage block 120 that is full must be stored in the new working storage block as the basis of the count of the new working storage block, and the new working storage block continues to count on the basis of the stored count data. The first unit 121 may be used to record the count data recorded in the working storage block that is full.

The data recorded in the second unit 122 may be used to characterize whether the working storage block 120 needs to be erased and programmed. Specifically, the flag bit has only two data states, one data state characterizing that the working storage block 120 needs to be erased and programmed (e.g., 00), and another data state characterizing that the working storage block 120 has been erased and programmed without further erasing and programming operations (e.g., FF).

The validity of the check bit in the third unit 123 may be used to characterize whether the data in the first unit 121 and the second unit 122 of a storage block 120 are valid. Specifically, a value may be generated by performing some check operation (such as an addition operation, a parity operation, an exclusive OR operation, or a cyclic redundancy check operation) for both the data in the first unit 121 and the second unit 122, and is then compared with another value in the third unit 123. If the two values are equal, the check bit in the third unit 123 is valid, that is, the data in the storage block 120 corresponding to the third unit 123 is valid, and no abnormality occurs in the data, and it is also indicated that the storage block is a working storage block. If the two values are unequal, the check bit 123 is invalid, that is, the data in the storage block 120 corresponding to the third unit 123 is invalid, or an abnormality has occurred, it is also indicated that the storage block is not the working storage block.

The plurality of count storage units 124 are units for sequentially storing at least one data bit of count data. Generally, in order to increase the amount of storage in the storage block 120 and reduce the number of times of erasing the storage block 120, each of the storage blocks 120 can include a plurality of count storage units 124.

It should be noted that the data bit in the count storage units 124 may indicate with n zeros that the count value of the monotonic counter 100 is incremented by one. When the logic determination circuitry 112 determined that the count storage units 124 are not all full, preset data can be written again in one of the count storage units 124 of the working storage block into which the data bit of the count data is stored last. The method of writing the preset data again may include supplementarily writing or rewriting the preset data. An example that n is 8 and three zeros has been written into the one of the count storage units 124 of the working storage block 120 into which the data bit of the count data is stored last before the interrupt of the monotonic counter 100 is taken. The method A of supplementarily writing the preset data is to supplementarily write five zeros in the count storage unit 124. Alternatively, the method B of rewriting the preset data is to rewrite eight zeros in the count storage unit 124, where the eight zeros contain three zeros that has been written.

It should be readily understood that, after the logic determination circuitry 112 completes the operation of writing the preset data again in the one of the count storage units 124 of the working storage block 120, the logic determination circuitry 112 can write the data in a first one of the count storage units 124 of the working storage block 120, in which the data bit of the count data has not been stored, to continue counting.

It should be readily understood that the logic determination circuitry 112 may ensure that, when an interrupt occurs in the monotonic counter 100, the working storage block 120 in the monotonic counter 100 is in the previously described operation state of "1" (1 indicates that the working storage block is full or not) and then the monotonic counter 100 is powered on, an abnormality will not occur in the reading/writing operation of the monotonic counter 100.

Further, for such a case that the storage block 120 in the monotonic counter 100 is in the previously described operation state of "2" (2 indicates that the working storage block is fully but a new working storage block has not been switched so as to continue counting) when an interrupt occurs, an embodiment of the present application has the following solution so as to ensure that an abnormality will not occur in the reading/writing operation of the monotonic counter 10 after the monotonic counter 100 is powered on.

When the logic determination circuitry 112 determined that the count storage units 124 of the working storage block 120 are all full, the logic determination circuitry 112 can determine whether set another one of the plurality of storage block 120 is switched (where the another storage block 120 stores movement data and the movement data is the data stored in the working storage block that is full). When the switching is not performed, the logic determination circuitry 112 can switch the another storage block 120 as a new working storage block in place of the working storage block that is full, then write the current count value to the first unit 121 of the new working storage block, and write the check bit and the flag bit into the third unit 123 and the second unit 122 of the new working storage block.

It should be noted that the current count value may be a sum of the data bit and the count base bit stored in the working storage block 120 that is full, and the sum of the recorded data refers to a sum of the count base bit of the working storage block 120 and the data bit of the working storage block 120. In practical applications, the monotonic counter 100 is generally used with the flash memory, and each time the flash memory reads and writes data, 1 is written in the count storage unit in the working storage block of the monotonic counter 100, so that the value of the data bit plus the count base bit in the working storage block 120 is equal to the current count value. For example, the data bit 124 may indicate with n zeros that the count value of the monotonic counter 100 is incremented by 1 (where, n is an integer greater than or equal to 1). When the count base bit of the monotonic counter 100 is 1000, n is 8, and the data bit 124 has three bytes of zeros, the current count value of the monotonic counter 100 is 1003 at the current moment.

Further, after the above-mentioned operation of "writing the current count value to the first unit 121 of the new working storage block, and writing the check bit and the flag bit into the third unit 123 and the second unit 122 of the new working storage block" is completed, the logic determination circuitry 112 may perform destroying of the check bit stored in the third unit 123 of the working storage block that is full so that the destroyed check bit are inconsistent with the check bit stored in the third unit 123 of the new working storage block, to better distinguish the working storage block that is full from the new working storage block.

It should be noted that the destroying operation of the logic determination circuitry 112 is to rewrite the data in the check bit stored in the third unit 123 of the working storage block that is full as any value different from a current value of check bit stored in the third unit of the new working storage block. Thus, even if an erasure operation of the working storage block that is full has not been performed, the value computed based on the count base bit and the flag bit stored in the working storage block that is full is also different from the value of the check bit stored in the new working storage block. That is, it is indicated that the working storage block that is full is not a storage block that is used to continue counting next, thereby ensuring correctness of the counting.

Further, after the above-mentioned operation of "destroying of the check bit stored in the third unit 123 of the working storage block that is full so that the destroyed check bit are inconsistent with the check bit stored in the third unit 123 of the new working storage block" is completed, the logic determination circuitry 112 may erase the working storage block that is full, and then write data in a first one of the count storage units 124 of the new working storage block, in which the data bit of the count data have not been stored, to continue counting.

Further, for such a case that the storage block 120 in the monotonic counter 100 is in the previously described operation state of "3" (3 indicates that the new working storage block has been switched so as to continue counting, but the working storage block that is full has not yet erased) when an interrupt occurs, an embodiment of the present application has the following solution so as to ensure that an abnormality will not occur in the reading/writing operation of the monotonic counter 10 after the monotonic counter 100 is powered on.

When the logic determination circuitry 112 determined that the count storage units 124 of the working storage block 120 are all full, and further determined that set another storage block of the plurality of storage blocks 120 has been switched as a new working storage block, the logic determination circuitry 112 could determine whether the working storage block that is full has been erased. When the erasure is not performed, the logic determination circuitry 112 first completes writing of the counting base bit, the flag bit, and the check bit into the new working storage block, and then destroy the check bit stored in the working storage block that is full so that the check bit is inconsistent with check bit of the new working storage block, to better distinguish the working storage block that is full from the new working storage block.

It should be noted that the destroying operation of the logic determination circuitry 112 is to rewrite the data in the check bit stored in the third unit 123 of the working storage block that is full as any value different from a current value of check bit stored in the third unit of the new working storage block. Thus, even if an erasure operation of the working storage block that is full has not been performed, the value computed based on the count base bit and the flag bit stored in the working storage block that is full is also different from the value of the check bit stored in the new working storage block. That is, it is indicated that the working storage block that is full is not a storage block that is used to continue counting next.

Further, after the above-mentioned operation of "destroying of the check bit stored in the third unit 123 of the working storage block that is full so that the destroyed check bit is inconsistent with the check bit stored in the third unit 123 of the new working storage block" is completed, the logic determination circuitry 112 may erase the working storage block that is full, and then write data in a first one of the count storage units 124 of the new working storage block, in which the data bit of the count data have not been stored, to continue counting.

Further, for such a case that the storage block 120 in the monotonic counter 100 is in the previously described operation state of "4" (4 indicates that the new working storage block has been switched so as to continue counting, but the working storage block that is full is being erased) when an interrupt occurs, an embodiment of the present application has the following solution so as to ensure that an abnormality will not occur in the reading/writing operation of the monotonic counter 10 after the monotonic counter 100 is powered on.

When the logic determination circuitry 112 determined that the count storage units 124 of the working storage block 120 are all full, and further determined that the working storage block 120 that is full is being erased, the logic determination circuitry 112 can perform the erasure operation on the working storage block again to ensure that the data stored in the working storage block is completely erased. Thereafter, the data is written in the first one of the count storage units 124 of the new working storage block, in which the data bit of the count data have not been stored, to continue counting.

In particular, interrupt resulting from abnormality of the monotonic counter 100 specifically includes interrupt resulting from power failure, abnormal reset, and other abnormal conditions.

In contrast with the related art, the present application provides the monotonic counter 100 including the controller 110 and the plurality of storage blocks 120, where each of the plurality of storage blocks 120 includes a first unit for storing at least one count base bit 121, a second unit for storing at least one flag bit 122, a third unit for storing at least one check bit 123, and a plurality of count storage units for sequentially storing at least data bit of count data 124, and at any time when the monotonic counter is in operation, there may be one of the plurality of storage blocks 120 serving as a working storage block for counting, where the controller 110 includes interrupt recording circuitry 111 for recording an interrupt occurring in the monotonic counter 100; and logic determination circuitry 112 for determining, upon determining that the monotonic counter 100 with the interrupt has been powered on and reset, whether the count storage units 124 of the working storage block are all full or not, and in response to determining that the count storage units 124 of the working storage block are not all full, writing preset data again in one of the count storage units 124 of the working storage block into which the data bit of the count data is stored last. As a result, when the abnormality occurs in the monotonic counter 100, it is possible to ensure that the count data recorded in the monotonic counter 100 is completely written, thereby effectively preventing an error in the counting operation of the monotonic counter 100 when the abnormality occurs in the monotonic counter 100.

Figure 2:
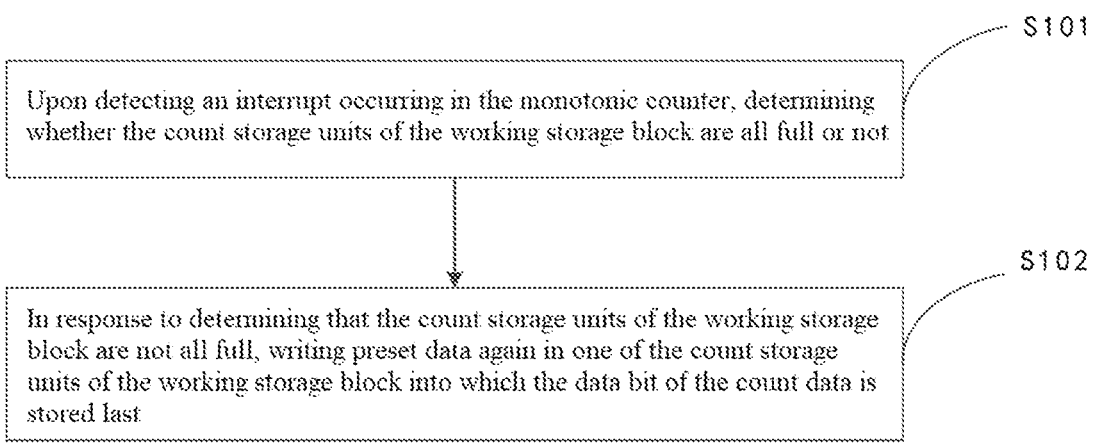
FIG. 2 is a flowchart of a counting method by a monotonic counter according to an embodiment of the present application.

Referring to FIG. 2, which is a flow diagram of a counting method for a monotonic counter 100 according to an embodiment of the present application, the counting method is applied to the monotonic counter 100 including a plurality of storage blocks, where each of the storage blocks includes a first unit for storing at least one count base bit, a second unit for storing at least one flag bit, a third unit for storing at least one check bit, and a plurality of count storage units for sequentially storing at least one data bit of count data, and at any time when the monotonic counter is in operation, there is one of the plurality of storage blocks serving as a working storage block for counting.

It should be noted that the monotonic counter 100 is used to ensure the confidentiality and integrity of reading and/or writing data from/into a memory corresponding to the counter, and the count data in the monotonic counter 100 can be monotonically incremented. Since the count storage units of each of the storage blocks in the monotonic counter 100 are limited, when the count storage units in one working storage block in the monotonic counter 100 are full, a new working storage block or the working storage block may have been erased may be switched, so as to continue counting. When the new working storage block is switched so as to continue counting, the count data of the working storage block that is full must be stored in the new working storage block as the basis of the count of the new working storage block, and the new working storage block continues to count on the basis of the stored count data. The first unit may be used to record the count data recorded in the working storage block that is full.

The data recorded in the second unit may be used to characterize whether the working storage block needs to be erased and programmed. Specifically, the flag bit may have only two data states, one data state characterizing that the working storage block needs to be erased and programmed (e.g., 00), and another data state characterizing that the working storage block has been erased and programmed without further erasing and programming operations (e.g., FF).

The validity of the check bit in the third unit may be used to characterize whether the data in the first unit and the second unit of a storage block are valid. Specifically, a value may be generated by performing some check operation (such as an addition operation, a parity operation, an exclusive OR operation, or a cyclic redundancy check operation) for both the data in the first unit and the second unit, and is then compared with another value in the third unit. If the two values are equal, the check bit in the third unit is valid, that is, the data in the storage block corresponding to the third unit is valid, and no abnormality occurs in the data, and it is also indicated that the storage block is a working storage block. If the two values are unequal, the check bit is invalid, that is, the data in the storage block corresponding to the third unit is invalid, or an abnormality has occurred, it is also indicated that the storage block is not the working storage block.

The plurality of count storage units are units for sequentially storing at least one data bit of count data. Generally, in order to increase the amount of storage in the storage block and reduce the number of times of erasing the storage block, each of the storage blocks can include a plurality of count storage units.

A detailed flow of the counting method applied to the monotonic counter 100 is described below with reference to FIG. 2.

A first determination step S101: upon detecting an interrupt occurring in the monotonic counter, determining whether the count storage units of the working storage block are all full or not.

In particular, the interrupt occurs in the monotonic counter 100 due to power failure, an abnormal reset, and other abnormal conditions of the monotonic counter 100.

A rewriting step S102: in response to determining that the count storage units of the working storage block are not all full, writing preset data again in one of the count storage units of the working storage block into which the data bit of the count data is stored last.

It should be noted that the data bit may indicate with n zeros that the count value of the monotonic counter 100 is incremented by one. In the rewriting step S102, the method of writing the preset data may include supplementarily writing or rewriting the preset data. An example that n is 8 and three zeros has been written into the one of the count storage units of the working storage block into which the data bit of the count data are stored last before the interrupt of the monotonic counter 100 is taken. The method A of supplementarily writing the preset data is to supplementarily write five zeros in the count storage unit. Alternatively, the method B of rewriting the preset data is to rewrite eight zeros in the count storage unit, where the eight zeros contain three zeros that has been written.

It should be readily understood that the rewriting step S102 may ensure that, when an interrupt occurs in the monotonic counter 100, the storage block in the monotonic counter 100 is in the previously described operation state of "1" (1 indicates that that the working storage block is full or not) and then the monotonic counter 100 is powered on, an abnormality will not occur in the reading/writing operation of the monotonic counter 100.

Figure 3:
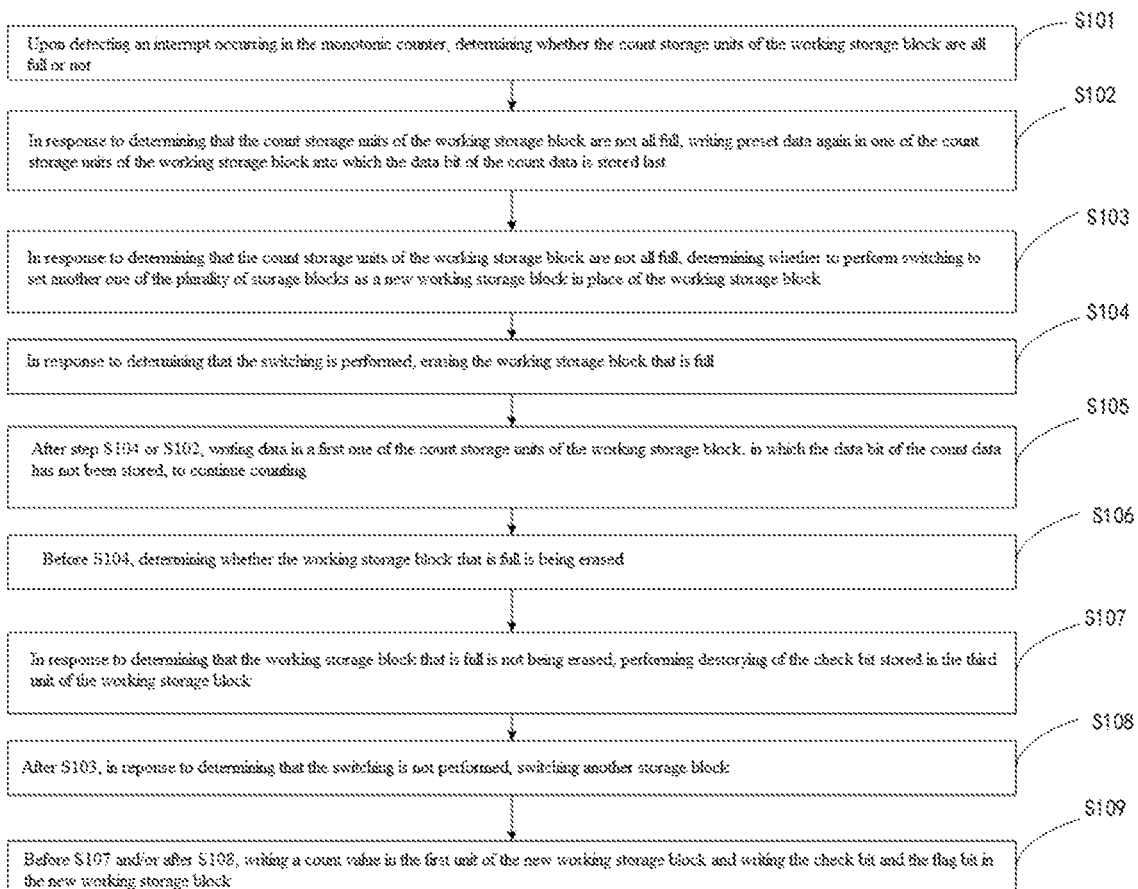
FIG. 3 is a flowchart of a counting method by a monotonic counter according to another embodiment of the present application.

Further, referring to FIG. 3, which is a further flow diagram of a counting method of a monotonic counter 100 according to an embodiment of the present application. As shown in FIG. 3, since the result of the first determination step S101 further includes a case in which "the working storage block is full", the method may further include, after the first determination step S101: a second determination step S103: determining whether to perform switching to set another one of the plurality of storage blocks as a new working storage block in place of the working storage block when the result of the first determination step S101 indicates that the working storage block is full; and an erasure step S104: erasing the working storage block that is full when the result of the second determination step S103 indicates that the switching is performed.

The another storage block stores movement data and the movement data is the data stored in the working storage block that is full.

Further, after the erasure step S104 or the rewriting step S102, the method further includes: a counting step S105: writing data in a first one of the count storage units of the working storage block, in which the data bit of the count data has not been stored, to continue counting.

Further, before the erasure step S104, the method further includes: a third determination step S106: determining whether the working storage block that is full is being erased; and a destroying step S107: performing destroying of the check bit stored in the third unit of the working storage block when the result of the third determination step S106 indicates that the working storage block that is full is not being erased, so that the destroyed check bit is inconsistent with the check bit stored in the third unit of the new working storage block.

It should be noted that the destroying step S107 is to better the working storage block that is full from the new working storage block. Specifically, in the destroying step S107, the data in the check bit stored in the third unit of the working storage block that is full may be rewritten as any value different from a current value of check bit stored in the third unit of the new working storage block. Thus, even if an erasure operation of the working storage block that is full has not been performed, the value computed based on the count base bit and the flag bit stored in the working storage block that is full is also different from the value of the check bit stored in the new working storage block. That is, it is indicated that the working storage block that is full is not a storage block that is used to continue counting next, thereby ensuring correctness of the counting.

Further, if the result of the third determination step S106 indicates that the erasure of the working storage block has been performed after the third determination step S106, the erasure step S104 can be directly performed, that is, the erasure can be performed on the working storage block again to ensure that the data stored in the working storage block is completely erased.

Further, since the result of the second determination step S103 further includes a case in which "the another storage block has not been switched as a new working storage block", the method may further include, after the second determination step S103: a switching step S108: switching the another storage block when the result of the second determination step S103 indicates that the another storage block has not been switched as the new working storage block.

Thereafter, the destroying step S107 of destroying of the check bit stored in the third unit of the working storage block is performed, so that the destroyed check bit is inconsistent with the check bit stored in the third unit of the new working storage block.

It should be noted that, since writing of the count base bit, the check bit and the flag bit into the monotonic counter 100 needs to be completed before the destroying step S107 and/or after the switching step S108, the method further includes, before the destroying step S107 and/or after the switching step S108: a writing step S109: writing a count value in the first unit of the new working storage block and writing the check bit and the flag bit in the new working storage block.

It should be noted that the current count value may be a sum of the data bit and the count base bit stored in the working storage block that is full, and the sum of the recorded data refers to a sum of the count base bit of the working storage block and all the data bit of the working storage block. In practical applications, the monotonic counter 100 is generally used with the flash memory, and each time the flash memory reads and writes data, 1 is written in the count storage unit in the working storage block of the monotonic counter 100, so that the value of the data bit plus the count base bit in the working storage block is equal to the current count value. For example, the data bit may indicate with n zeros that the count value of the monotonic counter 100 is incremented by 1 (where, n is an integer greater than or equal to 1). When the count base bit of the monotonic counter 100 is 1000, n is 8, and the data bit have three bytes of zeros, the current count value of the monotonic counter 100 is 1003 at the current moment.

It should be readily understood that the erasure step S104 and the destroying step S107 described above may ensure that, when the interrupt occurs in the monotonic counter 100, the storage block in the monotonic counter 100 is in the previously described operation states of "2" (2 indicates that the working storage block is fully but a new working storage block has not been switched so as to continue counting), "3" (3 indicates that the new working storage block has been switched so as to continue counting, but the working storage block that is full has not yet erased), and "4" (4 indicates that the new working storage block has been switched so as to continue counting, but the working storage block that is full is being erased) and then the monotonic counter 100 is powered on, the abnormality will not occur in the reading/writing operation of the monotonic counter 100, thereby effectively preventing an error in the counting operation of the monotonic counter 100 when the abnormality occurs in the monotonic counter 100.

In contrast with the related art, the present application provides the counting method for the monotonic counter 100, the counting method is applied to the monotonic counter 100 including a plurality of storage blocks, where each of the storage blocks includes a first unit for storing at least one count base bit, a second unit for storing at least one flag bit, a third unit for storing at least one check bit, and a plurality of count storage units for sequentially storing at least one data bit of count data, and at any time when the monotonic counter is in operation, there is one of the plurality of storage blocks serving as a working storage block for counting, where the counting method includes upon detecting an interrupt occurring in the monotonic counter, determining whether the count storage units of the working storage block are all full or not, and in response to determining that the count storage units of the working storage block are not all full, writing preset data again in one of the count storage units of the working storage block into which the data bit of the count data is stored last. As a result, when the abnormality occurs in the monotonic counter 100, it is possible to ensure that the count data recorded in the monotonic counter 100 is completely written, thereby effectively preventing the error in the counting operation of the monotonic counter 100 when the abnormality occurs in the monotonic counter 100.

Some embodiments of the present application have been described above, but not intended to limit the present application. Those of ordinary skill in the art can make various modifications and changes without departing from the spirit and scope of the present application. Therefore, the scope of the present application is defined by the claims.

What is claimed is:

1. A monotonic counter, comprising a controller and a plurality of storage blocks,
   wherein each of the storage blocks comprises a first unit for storing at least one count base bit, a second unit for storing at least one flag bit, a third unit for storing at least one check bit, and a plurality of count storage units for sequentially storing at least one data bit of count data, and at any time when the monotonic counter is in operation, there is one of the plurality of storage blocks serving as a working storage block for counting,
   wherein the controller comprises:

interrupt recording circuitry for recording an interrupt occurring in the monotonic counter; and logic determination circuitry for determining, upon determining that the monotonic counter with the interrupt has been powered on and reset, whether the count storage units of the working storage block are all full or not, and in response to determining that the count storage units of the working storage block are not all full, writing preset data again in one of the count storage units of the working storage block into which the data bit of the count data is stored last, wherein the writing of the preset data again comprises supplementarily writing or rewriting the preset data.

2. The monotonic counter of claim 1, wherein the logic determination circuitry is further configured to, in response to determining that the count storage units of the working storage block are all full, determine whether to perform switching to set another one of the plurality of storage blocks as a new working storage block in place of the working storage block, and configured to erase the working storage block after performing the switching.

3. The monotonic counter of claim 1, wherein the logic determination circuitry is further configured to, after writing the preset data again in the one of the count storage units of the working storage block, write data in a first one of the count storage units of the working storage block, in which the data bit of the count data has not been stored, to continue counting.

4. The monotonic counter of claim 2, wherein the logic determination circuitry is further configured to, after erasing the working storage block, write data in a first one of the count storage units of the new working storage block, in which the data bit of the count data has not been stored, to continue counting.

5. The monotonic counter of claim 2, wherein the logic determination circuitry is further configured to, before erasing the working storage block, determine whether the working storage block is being erased and, in response to determining that the working storage block is not being erased, perform destroying of the check bit stored in the third unit of the working storage block, so that the destroyed check bit is inconsistent with the check bit stored in the third unit of the new working storage block.

6. The monotonic counter of claim 5, wherein the destroying comprises rewriting the check bit stored in the third unit of the working storage block.

7. The monotonic counter of claim 2, wherein the logic determination circuitry is further configured to write a count value in the first unit of the new working storage block and write the check bit and the flag bit in the new working storage block, the count value being obtained by calculating a sum of the data bit of the count data and the count base bit stored in the working storage block.

8. The monotonic counter of claim 5, wherein the logic determination circuitry is further configured to, before performing the destroying, write a count value in the first unit of the new working storage block and write the check bit and the flag bit in the new working storage block, the count value being obtained by calculating a sum of the data bit of the count data and the count base bit stored in the working storage block.

9. The monotonic counter of claim 1, wherein the interrupt comprises power failure or abnormal reset.

10. A counting method by a monotonic counter comprising a plurality of storage blocks, wherein each of the storage blocks comprises a first unit for storing count base bit, a second unit for storing flag bit, a third unit for storing check bit, and a plurality of count storage units for sequentially storing data bit of count data, and at any time when the monotonic counter is in operation, there is one of the plurality of storage blocks serving as a working storage block for counting, and wherein the counting method comprises:

upon detecting an interrupt occurring in the monotonic counter, determining whether the count storage units of the working storage block are all full or not; and in response to determining that the count storage units of the working storage block are not all full, writing preset data again in one of the count storage units of the working storage block into which the data bit of the count data is stored last, wherein the writing of the preset data again comprises supplementarily writing or rewriting the preset data.

11. The counting method of claim 10, further comprising:
in response to determining that the count storage units of the working storage block are all full, determining whether to perform switching to set another one of the plurality of storage blocks as a new working storage block in place of the working storage block; and erasing the working storage block after performing the switching.

12. The counting method of claim 10, further comprising:
after writing the preset data again in the one of the count storage units of the working storage block, writing data in a first one of the count storage units of the working storage block, in which the data bit of the count data has not been stored, to continue counting.

13. The counting method of claim 11, further comprising:
after erasing the working storage block, writing data in a first one of the count storage units of the new working storage block, in which the data bit of the count data has not been stored, to continue counting.

14. The counting method of claim 11, further comprising:
before erasing the working storage block,
determining whether the working storage block is being erased; and in response to determining that the working storage block is not being erased, performing destroying of the check bit stored in the third unit of the working storage block, so that the destroyed check bit is inconsistent with the check bit stored in the third unit of the new working storage block.

15. The counting method of claim 14, wherein the destroying comprises rewriting the check bit stored in the third unit of the working storage block.

16. The counting method of claim 11, further comprising:
writing a count value in the first unit of the new working storage block and writing the check bit and the flag bit in the new working storage block, the count value being obtained by calculating a sum of the data bit of the count data and the count base bit stored in the working storage block.

17. The counting method of claim 14, further comprising:
before performing the destroying,
writing a count value in the first unit of the new working storage block and writing the check bit and the flag bit in the new working storage block, the count value being obtained by calculating a sum of the data bit of the count data and the count base bit stored in the working storage block.

18. The counting method of claim 10, wherein the interrupt comprises power failure or abnormal reset.

* * * * *